United States Patent
Sahashi et al.

[11] Patent Number: 5,565,830
[45] Date of Patent: Oct. 15, 1996

[54] RARE EARTH-COBALT SUPERMAGNETOSTRICTIVE ALLOY

[75] Inventors: Masashi Sahashi; Tadahiko Kobayashi, both of Yokohama, Japan

[73] Assignee: Kabushiki Kaisha Toshiba, Kanagawa-ken, Japan

[21] Appl. No.: 158,813

[22] Filed: Nov. 29, 1993

Related U.S. Application Data

[63] Continuation of Ser. No. 578,649, Sep. 7, 1990, abandoned.

[30] Foreign Application Priority Data

Sep. 8, 1989 [JP] Japan .................................. 1-233594

[51] Int. Cl.$^6$ ........................................................ H01F 7/00
[52] U.S. Cl. .......................... 335/215; 148/301; 420/83; 420/416; 420/435; 310/25
[58] Field of Search .............................. 148/301; 420/83, 420/416, 435; 310/25; 335/215

[56] References Cited

U.S. PATENT DOCUMENTS

| | | | |
|---|---|---|---|
| 4,308,474 | 12/1981 | Savage et al. | 310/26 |
| 4,374,665 | 2/1983 | Koon | 148/304 |
| 4,378,258 | 3/1983 | Clark et al. | 148/100 |
| 4,885,134 | 12/1989 | Hatwar | 148/301 |
| 4,946,501 | 8/1990 | Nate et al. | 420/416 |
| 4,957,549 | 9/1990 | Matsumoto et al. | 148/301 |

FOREIGN PATENT DOCUMENTS

| | | | |
|---|---|---|---|
| 0046075 | 2/1982 | European Pat. Off. | 420/435 |
| 60-9855 | 1/1985 | Japan | 420/416 |
| 60-237655 | 11/1985 | Japan | 148/301 |
| 62-222609 | 9/1987 | Japan | 148/301 |

*Primary Examiner*—John Sheehan
*Attorney, Agent, or Firm*—Finnegan, Henderson, Farabow, Garrett & Dunner, L.L.P.

[57] ABSTRACT

A rare earth-cobalt supermagnetostrictive alloy having a composition represented by the general formula, in atomic fraction: R $(Co_{1-x}Fe_x)_z$, wherein $0.001 \leq x \leq 0.8$, $0.2 \leq z \leq 15$, and R is at least one element selected from the group consisting of Sc, Y, La, Ce, Pr, Nd, Pm, Sm, Eu, Gd, Tb, Dy, Ho, Er, Tm, Yb, and Lu and is consisting essentially of a cubic system whose easy axis of magnetization is generally <100> or <110> oriented; or R $(Co_{1-x}Fe_x)_z$, wherein $0.001 \leq x \leq 0.8$, $0.2 \leq z \leq 15$, and R is at least one element selected from the group consisting of Sc, Y, La, Ce, Pr, Nd, Sm, Gd, Dy, Er, Yb, and Lu. Such an alloy exhibits satisfactory magnetostriction in a wide range of temperatures from room temperature to liquid nitrogen temperature.

9 Claims, 1 Drawing Sheet

FIG. I
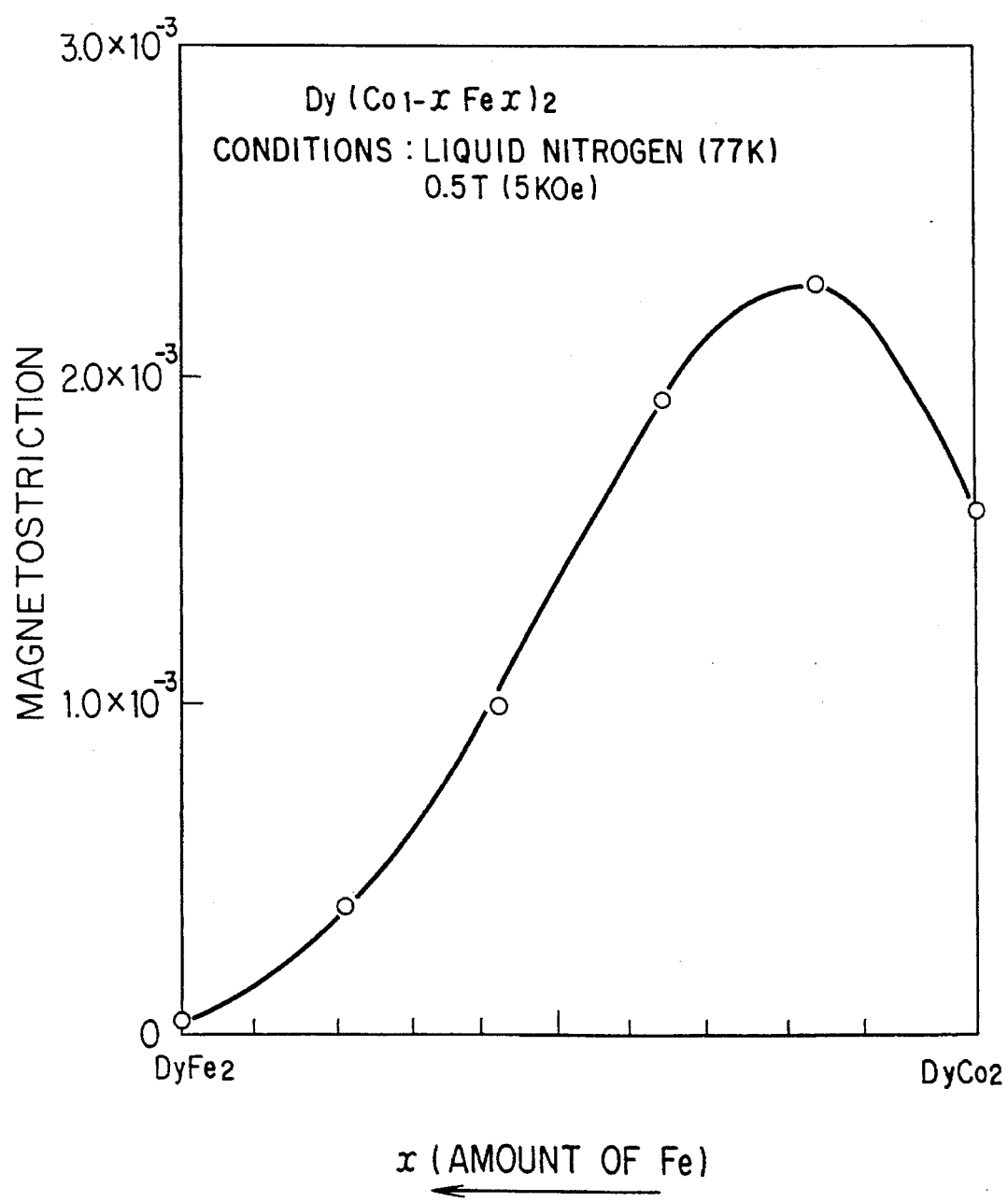

RARE EARTH-COBALT SUPERMAGNETOSTRICTIVE ALLOY

This application is a continuation of application Ser. No. 07/578,549 filed Sep. 7, 1990, now abandoned.

BACKGROUND OF THE INVENTION

1. Field of the Invention

This invention relates to supermagnetostrictive alloys adapted for forming magnetostrictive elements to be used in devices for converting between magnetic energy and mechanical energy. More particularly, it is directed to rare earth-cobalt supermagnetostrictive alloys suitable for application in a wide range of temperatures including low temperatures of room temperature or below.

2. Description of the Related Art

It is known that magnetostriction, which is a strain caused when a magnetic field is applied externally to ferromagnetic substances such as Ni alloys, Fe-Co alloys, and ferrite, is applied to various devices such as magnetostrictive filters, magnetostrictive sensors, supersonic delay lines, magnetostrictive oscillators.

Recent developments in the field of instrumentation engineering and precision machinery require fine displacement control on the order of microns and thus demands that a displacement drive unit for the fine displacement control be developed. As a means for a drive mechanism of such a drive unit, attention has been given to the use of a device for converting between the magnetic and mechanical energy utilizing magnetostriction of a magnetostrictive substance.

However, conventionally known magnetostrictive materials (magnetostrictive substances) generally exhibit only a small displacement in absolute terms, thereby not being considered fully practicable. That is, conventional magnetostrictive materials are not satisfactory not only in terms of absolute drive displacement but also in terms of precision control as a displacement control drive means for which an accuracy in the order of microns is required.

On the other hand, as highly magnetostrictive materials, rare earth magnetostrictive alloys are disclosed, e.g., in the specification of U.S. Pat. No. 4,378,258 and Japanese Patent Examined Publication No. 33892/1987. However, rare earth-iron alloys are not satisfactory in that their magnetostriction is reduced at a low temperature range, nor are rare earth-cobalt alloys suitable for use in a high temperature environment because their Curie temperature is low. That is, the rare earth magnetostrictive alloys are, in general, not acceptable as a displacement control drive means that must be able to perform desired functions accurately in the order of microns in a wide range of temperatures from low (at room temperature) to high temperatures.

As an exception, $TbFe_2$, whose easy axis of magnetization is <111> oriented among rare earth-iron alloys of the above type, is known to maintain and exhibit excellent magnetostriction at low temperatures (room temperature or lower). However, $TbFe_2$ is not only inferior in oxidation resistance and sinterability but also disadvantageous in that it increases both the size and cost of the device as it requires a relatively large magnetic field in order to obtain a predetermined magnetostriction. Further, $Tb(Fe_{0.8}Co_{0.2})_2$, obtained by replacing part of Fe by Co is also known. This is a modification of $TbFe_2$ with oxidation resistance and other properties improved and its easy axis of magnetization is also <111> oriented. However, $Tb(Fe_{0.8}Co_{0.2})_2$ is costly as a material and thus not economically advantageous as a general purpose material except for special applications.

It is, therefore, an object of this invention to provide a rare earth-cobalt supermagnetostrictive alloy that not only can maintain and exhibit excellent magnetostriction in a wide range of temperatures but also is relatively inexpensive and general purpose.

Another object of this invention is to provide a rare earth-cobalt supermagnetostrictive alloy suitable for use in displacement control drive means capable of functioning accurately in the order of microns.

SUMMARY OF THE INVENTION

A rare earth-cobalt supermagnetostrictive alloy according to this invention has a composition represented by the general formula, in atomic fraction:

(1) R $(Co_{1-x}Fe_x)_z$ 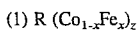

wherein $0.001 \leq x \leq 0.8$ and $0.2 \leq z \leq 15$ and R is at least one element selected from the group consisting of Sc, Y, La, Ce, Pr, Nd, Pm, Sm, Eu, Gd, Tb, Dy, Ho, Er, Tm, Yb, and Lu and consists essentially of a cubic system whose easy axis of magnetization is generally <100> or <110> oriented; or (2) R $(Co_{1-x}Fe_x)_z$ 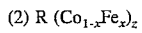

wherein $0.001 \leq x \leq 0.8$ and $0.2 \leq z \leq 15$ and R is at least one element selected from the group consisting of Sc, Y, La, Ce, Pr, Nd, Sm, Gd, Dy, Er, Yb, and Lu.

BRIEF DESCRIPTION OF THE DRAWING

FIG. 1 is a diagram showing an example of magnetostriction of a rare earth-cobalt supermagnetostrictive alloy according to this invention.

DETAILED DESCRIPTION OF THE PREFERRED EMBODIMENTS

Rare earth-cobalt supermagnetostrictive alloys according to this invention will be described below.

Referring briefly to a history of this invention, the inventors positively sought further research on Tb-Dy-Fe cubic system Laves type intermetallic compounds that have been disclosed in the above-mentioned specification of U.S. Pat. No. 4,378,258 and the like as having excellent magnetostriction and having the easy axis of magnetization in <111> direction. That is, they paid attention to the conventionally accepted opinion that when an Fe magnetostrictive alloy has its easy axis of magnetization in <100> direction, its magnetostriction is small. In other words, taking the Laves type intermetallic compounds of Dy and Fe, particularly, $DyFe_2$, as the subject, they studied a system in which Fe is replaced by Co. As a result, as far as the easy axis of magnetization is generally <100>, <110>, or likely oriented, the following facts were found, and this invention has been completed based on such facts.

(1) Supermagnetostriction characterized by a value far greater than that of a rare earth-iron substance is exhibited.

(2) Supermagnetostriction is exhibited in a magnetic field of as low as 0.2T (tesla) (2 kOe).

(3) Supermagnetostriction better than that exhibited by binary rare earth-cobalt intermetallic compounds is exhibited.

(4) Satisfactory supermagnetostriction is exhibited at cryogenic temperatures from 4.2K to liquid nitrogen temperature.

(5) Sinterability is good enough to allow thin film deposition and arbitrary forming to be performed.

In the rare earth-cobalt supermagnetostrictive alloys according to this invention, which is represented by the general formula, in atomic fraction, R $(Co_{1-x}Fe_x)_z$, z representing the atomic fraction of the rare earth and transition metal is always selected in the range of $0.2 < z < 15$ or, preferably, $z \leq 10$ or, more preferably, $1.5 \leq z \leq 5$, because it is difficult to obtain supermagnetostriction of $10^{-4}$ or more with $z > 15$ and no effect of replacement of iron can be exhibited with $0.2 > z$. Cubic systems having $z=2$, $z=23/6$, or $z=13$ may exhibit a satisfactory magnetostriction.

If the amount of replacement of iron x is smaller than 0.001, the effect of replacement is not exhibited. If $x > 0.8$, the iron, which is the transition metal, plays an influential role in determining its magnetostriction, thereby inducing a significant reduction in the magnetostriction with decreasing temperatures and thus becoming no longer practicable. Thus, the amount of replacement of iron x is always determined within the range of 0.001–0.8 or, preferably, 0.–0.5.

Further, in order to improve the mechanical properties without losing the properties as the rare earth-cobalt supermagnetostrictive alloys according to this invention, part of the component $(Co_{1-x}Fe_x)$ may be replaced by an element such as Ni, Mn, V, Nb, Ta, Cr, Mo, W, Ti, Zr, Hg, Al, Ga, Sm, Si, B, Ru, Rh, Re, Cu, (as designated by element "M"). The alloy may be represented by the formula $(Co_{1-x-y}Fe_xM_y)$ but in this case, the maximum value x can take is 0.5.

EXAMPLE 1

The elements Tb, Dy, Nd, Gd, Sm, Pr, Ce, La, Y, Er, Co, and Fe were respectively selected and weighed at a composition ratio (at%) shown in Table 1 and then subjected to an arc casting process to prepare 13 types of rare earth magnetostrictive alloys including a comparative example. The arc casting process was performed in an inert gas atmosphere such as an argon gas atmosphere using a copper container.

The prepared rare earth magnetostrictive alloys were then subjected to a thermal process for homogenization at 900° C. for 7 days (168 hours). Each sample was cut into a test piece of 10×10×5 mm.

Each test piece thus obtained was evaluated for magnetostriction at both room temperature (RT) and liquid nitrogen temperature ($N_2$) using a strain reluctance gauge. The result is also shown in Table 1.

The magnetostriction was measured in a magnetic field of 2 kOe produced by an opposite pole type electromagnet and the magnetostriction values are shown with that of $DyFe_2$, a comparative example, being 1 at room temperature for comparison.

As is apparent from Table 1, the rare earth-cobalt supermagnetostrictive alloys according to this invention has very large magnetostriction not only at room temperature but also at liquid nitrogen temperature in a low magnetic field. This means that the rare earth-cobalt supermagnetostrictive alloys according to the present invention exhibit excellent magnetostriction in a wide rage of temperatures from room temperature to liquid nitrogen temperature. The exhibited values can even be improved about 5–50% by controlling the content of impurities such as $O_2$, N, and Ca within the range of 10–1000 ppm.

Further, the alloys obtained by setting z in $Dy(Co_{1-x}Fe_x)_z$ to 23/6 (example 11) and 13 (example 12) provided satisfactory magnetostrictions, similar to other examples (1–10), at room temperature and liquid nitrogen temperature.

TABLE 1

| Sample No. | Alloy composition (at %) | Magnetostriction (RT) | Magnetostriction ($N_2$) | Easy axis of magnetization |
|---|---|---|---|---|
| 1 | Dy $(Co_{0.6}Fe_{0.4})_2$ | 10 | 100 | ~<100> |
| 2 | Dy $(Co_{0.4}Fe_{0.6})_3$ | 9 | 85 | |
| 3 | Nd $(Co_{0.7}Fe_{0.3})_5$ | 12 | 120 | |
| 4 | Gd $(Co_{0.8}Fe_{0.2})_2$ | 5 | 50 | ~<100> |
| 5 | Sm $(Co_{0.8}Fe_{0.2})_7$ | 3 | 20 | |
| 6 | Pr $(Co_{0.6}Fe_{0.4})_3$ | 5 | 80 | |
| 7 | Ce $(Co_{0.8}Fe_{0.2})_2$ | 5 | 45 | ~<100> |
| 8 | La $(Co_{0.8}Fe_{0.2})_2$ | 4 | 40 | ~<100> |
| 9 | Y $(Co_{0.5}Fe_{0.5})_2$ | | 45 | ~<100> |
| 10 | Er $(Co_{0.8}Fe_{0.2})_2$ | 12 | 150 | ~<100> |
| 11 | Dy $(Co_{0.6}Fe_{0.4})_{23/6}$ | 9 | 90 | |
| 12 | Dy $(Co_{0.6}Fe_{0.4})_{13}$ | 7 | 60 | |
| 13 | $(Gd_{0.4}Dy_{0.6})$ $(Co_{0.8}Fe_{0.2})_2$ | 15 | 120 | ~<100> |
| Comparative example | $DyFe_2$ | 1 | 0.3 | ~<100> |
| | $(Tb_{0.3}Dy_{0.7})$ $Fe_2$ | 10 | 1 | ~<111> |

The symbol "~" means "generally or substantially" in Table 1.

EXAMPLE 2

The elements Dy, Co, and Fe were respectively selected and weighed at a predetermined composition ratio (at%) and then subjected to the arc casting process in the similar manner as in Example 1 to prepare 6 types of rare earth magnetostrictive alloys including a comparative example. The prepared rare earth magnetostrictive alloys were then subjected to a thermal process for homogenization at 900° C. for 7 days (168 hours). Each sample was cut into a test piece of 10×10×5 mm.

Each test piece thus obtained was evaluated for magnetostriction at liquid nitrogen temperature (77K) using the strain gauge. The result is shown in FIG. 1.

The magnetostriction was measured in a magnetic field of 5 kOe produced by the opposite pole type electromagnet.

The alloys obtained by setting x in $Dy(Co_{1-x}Fe_x)_z$ to from 0.6 to 0.8 exhibited magnetostriction values lower than that of the $DyCo_2$ but their resistance to oxidation was acceptable. Thus, when used as a magnetostrictive oscillator for superconductive magnet actuators, they will exhibit excellent stability and reliability compared to a $DyCo_2$ magnetostrictive oscillator.

As is understood from the above description, the rare earth-cobalt supermagnetostrictive alloys according to this invention have not only greater sinterability, stability, and reliability, but also highly satisfactory magnetostriction, than the conventional magnetostrictive materials, thereby being suitable for use not only in actuators for precision machining but also in motors, speakers, dumpers, sonars, and the like. Particularly, such alloys exhibit practically acceptable magnetostriction at cryogenic temperatures including liquid nitrogen temperature and is thermally stable as well, thereby being applicable to various devices formed in combination with a superconductive coil such as switching actuators.

The fact that these alloys can easily produce a predetermined magnetostriction in a low magnetic field such as 0.2–0.5T or 2–5 kOe without fail not only contributes to reducing the size of the device body and peripherals but also allows their drive sources to be in compact design and drive forces to be reduced, thus providing a number of practical advantages.

What is claimed is:

1. A device for converting magnetic energy into mechanical energy comprising:

a magnetostrictive element including a rare earth-cobalt supermagnetostrictive alloy having a composition represented by the general formula, in atomic ratio:

$$R(Co_{1-x}Fe_x)_z$$

wherein $0.001 \leq x \leq 0.5$, $0.2 \leq z \leq 15$, and R is at least one element selected from the group consisting of Sc, Y, La, Ce, Pr, Nd, Pm, Sm, Eu, Gd, Tb, Dy, Ho, Er, Tm, Yb and Lu; and wherein said alloy consists essentially of cubic crystals having an easy axis of magnetization substantially <100> oriented with said alloy having a magnetostriction of more than three times that of $DyFe_2$; and magnetic field applying means for producing a strain in said magnetostrictive element.

2. The device according to claim 1, wherein z= 2, z=23/6, or z= 13.

3. The device according to claim 1, wherein $0.2 \leq z \leq 10$.

4. The device according to claim 1, wherein $1.5 \leq z \leq 5$.

5. The device according to claim 1, wherein R is at least one of Dy and Gd.

6. The device according to claim 1, wherein R is Dy and Gd with Dy being 50 at% or more and balance Gd.

7. The device according to claim 1, wherein when normalized by the magnetostriction value of $DyFe_2$ at room temperature, the magnetostriction value of said alloy is 10 or more at liquid nitrogen temperature.

8. A device which produces a strain in a magnetostrictive element by applying an external magnetic field, wherein said magnetostrictive element comprises a rare earth-cobalt supermagnetostrictive alloy having a composition represented by the general formula, in atomic ratio:

$$R(Co_{1-x}Fe_x)_z$$

wherein $0.001 \leq x > 0.8$, $0.2 \leq z \leq 15$, and R is at least one element selected from the group consisting of Sc, Y, La, Ce, Pr, Nd, Pm, Sm, Eu, Gd, Tb, Dy, Ho, Er, Tm, Yb and Lu, and wherein said alloy consists essentially of cubic crystals having an easy axis of magnetization substantially <100> or <110> oriented with said alloy having a magnetostriction of more than three times that of $DyFe_2$.

9. An actuator for precision machining, comprising:

a magnetostrictive alloy having a composition represented by the general formula, in atomic ratio:

$$R(Co_{1-x}Fe_x)_z$$

wherein $0.001 \leq x \leq 0.8$, $0.2 \leq z \leq 15$, and R is at least one element selected from the group consisting of Sc, Y, La, Ce, Pr, Nd, Pm, Sm, Eu, Gd, Tb, Dy, Ho, Er, Tm, Yb and Lu, and wherein said alloy consists essentially of cubic crystals having an easy axis of magnetization substantially <100> or <110> oriented with said alloy having a magnetostriction of more than three times that of $DyFe_2$; and magnetic field applying means for producing a strain in said magnetostrictive element.

* * * * *

UNITED STATES PATENT AND TRADEMARK OFFICE
CERTIFICATE OF CORRECTION

PATENT NO. : 5,565,830
DATED : October 15, 1996
INVENTOR(S) : Masashi SAHASHI et al.

It is certified that error appears in the above-indentified patent and that said Letters Patent is hereby corrected as shown below:

Claim 8, Column 6, line 9, "$0.001 \leq x > 0.8$" should read --$0.001 \leq x < 0.8$--.

Claim 9, Column 6, line 25, "$0.001 \leq x \leq 0.8$" should read --$0.001 \leq x < 0.8$--

Signed and Sealed this

Eighth Day of July, 1997

BRUCE LEHMAN

Attest:

Attesting Officer

Commissioner of Patents and Trademarks